United States Patent
Botti et al.

(10) Patent No.: US 10,935,592 B2
(45) Date of Patent: Mar. 2, 2021

(54) CURRENT SENSING CIRCUIT AND METHOD

(71) Applicants: STMicroelectronics S.r.l., Agrate Brianza (IT); STMicroelectronics (Shenzhen) R&D Co, Ltd., Shenzhen (CN)

(72) Inventors: Edoardo Botti, Vigevano (IT); Davide Luigi Brambilla, Segrate (IT); Hong Wu Lin, Shenzhen (CN)

(73) Assignees: STMICROELECTRONICS S.R.L., Agrate Brianza (IT); STMICROELECTRONICS (SHENZHEN) R&D CO, LTD., Shenzhen (CN)

( * ) Notice: Subject to any disclaimer, the term of this patent is extended or adjusted under 35 U.S.C. 154(b) by 105 days.

(21) Appl. No.: 16/057,089

(22) Filed: Aug. 7, 2018

(65) Prior Publication Data
US 2019/0049511 A1    Feb. 14, 2019

(30) Foreign Application Priority Data
Aug. 8, 2017 (IT) .................. 102017000091896

(51) Int. Cl.
*G01R 31/26*  (2020.01)
*H03K 17/0814*  (2006.01)
(Continued)

(52) U.S. Cl.
CPC ..... *G01R 31/2621* (2013.01); *G01R 19/0092* (2013.01); *G05F 3/08* (2013.01);
(Continued)

(58) Field of Classification Search
CPC .......... G01D 5/145; G01D 5/12; G01D 5/142; G01B 7/003; G01L 3/102; G01L 1/125; G01L 3/101; G01L 5/12
(Continued)

(56) References Cited

U.S. PATENT DOCUMENTS

| | | | | |
|---|---|---|---|---|
| 4,322,682 A | * | 3/1982 | Schadwill | .......... G01R 1/07328 324/750.25 |
| 5,329,692 A | * | 7/1994 | Kashiwagi | ......... H05K 13/0452 29/740 |

(Continued)

FOREIGN PATENT DOCUMENTS

| | | |
|---|---|---|
| EP | 0747713 A2 | 12/1996 |
| EP | 3179631 A1 | 6/2017 |
| WO | 2006129275 A1 | 12/2006 |

OTHER PUBLICATIONS

International IOR Rectifier, "uHVIC SOT-23 Current Sensing IC", Datasheet, IR25750LPBR, www.irf.com, Jan. 2015, 17 pages.
(Continued)

*Primary Examiner* — Giovanni Astacio-Oquendo
(74) *Attorney, Agent, or Firm* — Slater Matsil, LLP

(57) ABSTRACT

A circuit includes a field effect transistor having a gate driven via a drive signal. The field effect transistor has a drain-source voltage drop indicative of the intensity of a current flowing in the current path through the field effect transistor. The circuit also includes a pair of sensing transistors that include a first sensing field effect transistor arranged with its drain and gate coupled with the drain and the gate of the field effect transistor, respectively, and a second sensing field effect transistor having a gate configured for receiving a replica of the drive signal. The second sensing field effect transistor is arranged with its current path in series with the current path of the first sensing field effect transistor. A sensing signal at a sensing node is indicative of (Continued)

the current intensity flowing in the current path of the field effect transistor.

23 Claims, 5 Drawing Sheets

(51) Int. Cl.
    *G05F 3/08*     (2006.01)
    *G01R 19/00*     (2006.01)
    *H03K 17/687*     (2006.01)

(52) U.S. Cl.
    CPC ....... *H03K 17/0814* (2013.01); *H03K 17/687* (2013.01); *H03K 2217/0027* (2013.01)

(58) Field of Classification Search
    USPC .................. 324/762.09, 207.13, 207.11, 200
    See application file for complete search history.

(56) References Cited

U.S. PATENT DOCUMENTS

| | | | |
|---|---|---|---|
| 5,465,049 A * | 11/1995 | Matsuura | G01R 33/0358 324/248 |
| 5,506,510 A * | 4/1996 | Blumenau | G01R 1/07378 324/149 |
| 5,602,946 A * | 2/1997 | Veeser | G01P 3/486 250/227.21 |
| 5,646,520 A | 7/1997 | Frank et al. | |
| 5,719,497 A * | 2/1998 | Veeser | G01P 3/486 250/227.21 |
| 5,815,027 A | 9/1998 | Tihanyi et al. | |
| 9,046,430 B2 * | 6/2015 | Moran | G01L 3/103 |
| 9,152,163 B1 | 10/2015 | Fabbro et al. | |
| 10,715,046 B2 * | 7/2020 | Bianco | H02M 3/33538 |
| 2007/0263334 A1 | 11/2007 | Nishida | |
| 2010/0156383 A1 | 6/2010 | Mikami et al. | |
| 2012/0169377 A1 | 7/2012 | Thiele et al. | |
| 2014/0015046 A1 | 1/2014 | Thiele et al. | |
| 2017/0160316 A1 * | 6/2017 | Botti | H03F 3/2173 |

OTHER PUBLICATIONS

Texas Instruments, "TPSH160-Q1 40-V, 160-m Dual-Channel Smart High-Side Switch", TPS2H160-Q1, SLVSD74B, Dec. 2015, 40 pages.

* cited by examiner

CURRENT SENSING CIRCUIT AND METHOD

CROSS-REFERENCE TO RELATED APPLICATIONS

This application claims priority to Italian Patent Application No. 102017000091896, filed on Aug. 8, 2017, which application is hereby incorporated herein by reference.

TECHNICAL FIELD

The description relates to current sensing circuits and methods.

BACKGROUND

Electronic power devices oftentimes include circuits for sensing (measuring) the current flowing through certain parts of the device. Current sensing may be helpful for protection purposes as well as for diagnostics and other ancillary functions.

The output from current sensing circuits can be supplied to one or more comparators which are activated, e.g., as a result of certain thresholds being reached. In more complex systems, current behavior over time can be evaluated in a continuous manner, possibly by digitizing the signal.

In switching devices using MOS transistors as power components the intrinsic resistance existing between source and drain can be exploited for current sensing.

For instance, the current flowing through the device can be sensed based on the relationship:

$$Id = Vds/Rds(on)\_p$$

where:
Id=drain current
Vds=drain-source voltage
Rds(on)_p=drain-source resistance of the (power) device in the linear operating zone.

Such an approach is widely used. It facilitates achieving a desired result without adding further resistors along the current path. It also provides in most instances an adequate degree of accuracy.

SUMMARY

Embodiments of the invention relate to a current sensing circuit, and a corresponding device and method. One or more embodiments may be applied to, e.g., current sensing in MOS transistors in switching systems.

Despite the extensive activity in this area, further improved solutions are desirable under various respects, such as e.g., current sensing performed in a simple and compact manner with a high immunity to noise and other sources of nuisance, high-amplitude sensing signals, reduced sensing (readout) errors, and/or a limited number of circuit blocks involved in processing the current sensing signal. One or more embodiments contribute in providing such a solution.

According to one or more embodiments, a circuit includes a field effect transistor having a gate configured to be driven via a drive signal. The field effect transistor has a drain-source voltage drop indicative of the intensity of a current flowing in the current path through the field effect transistor. The circuit also includes a pair of sensing transistors that include a first sensing field effect transistor arranged with its drain and gate coupled with the drain and the gate of the field effect transistor, respectively, and a second sensing field effect transistor having a gate configured for receiving a replica of the drive signal. The second sensing field effect transistor is arranged with its current path in series with the current path of the first sensing field effect transistor. A sensing signal at a sensing node between the first sensing field effect transistor and the second sensing field effect transistor is indicative of the current intensity flowing in the current path of the field effect transistor.

One or more embodiments may relate to a corresponding device and a corresponding method.

One or more embodiments may be used in various types of devices such as, e.g., high-efficiency regulators, high-efficiency audio amplifiers (e.g., class D amplifiers) and a wide variety of bipolar CMOS DMOS (BCD) products.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
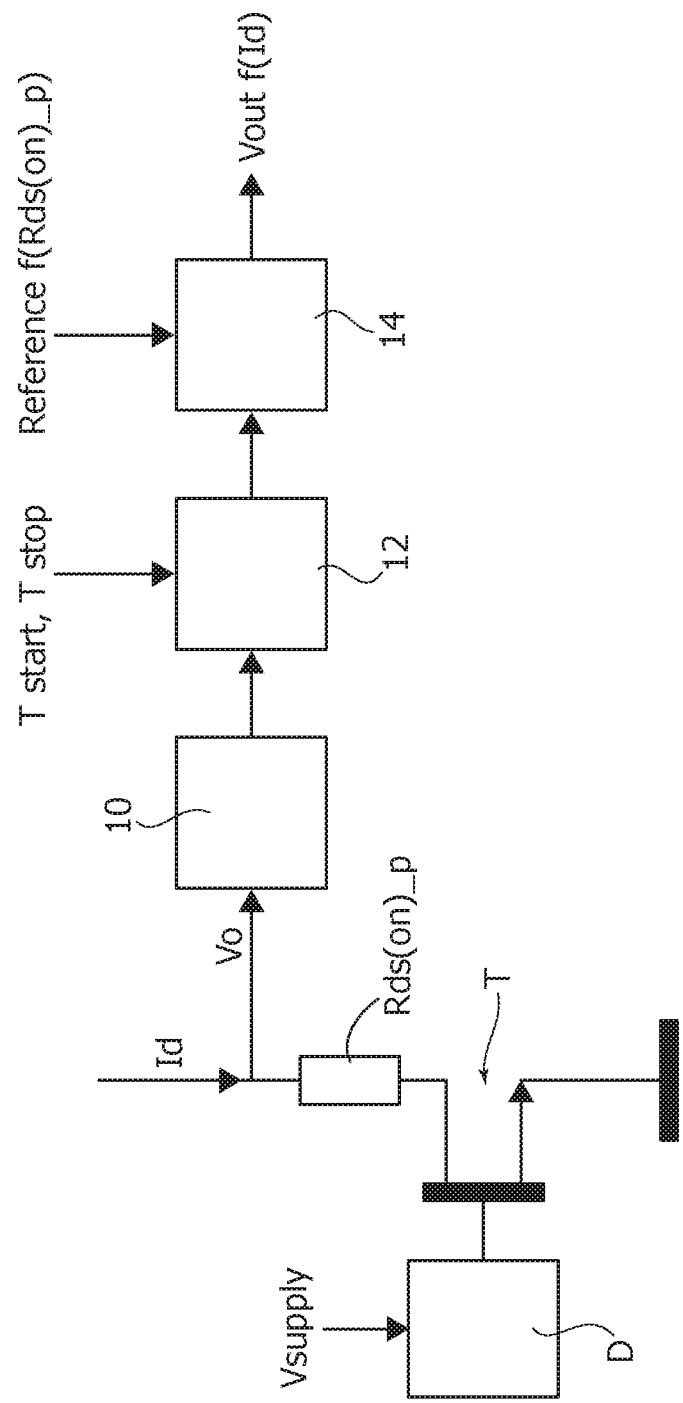
FIG. 1 is a diagram exemplary of a current sensing circuit.

The diagram of FIG. 1 is exemplary of an arrangement for sensing the drain-source current Id of a field-effect transistor T by reading the drain-source voltage Vds thereof.

A power MOS transistor will be considered as exemplary of such a field-effect transistor (FET) throughout this detailed description.

FIG. 1 refers by way of example to a N-channel MOS transistor configured for use as a "low-side" driver, for instance in an automotive application. Such an application is conventional in the art, which makes it unnecessary to provide a more detailed description herein.

The same disclosure provided in the following by referring (by way of example) to a N-channel MOS transistor and a "low-side" driver applies to a P-channel MOS transistor and/or a "high-side" driver: a corresponding detailed description will not be repeated for brevity.

In the diagram of FIG. 1, reference D denotes a driver circuit block coupled to the gate terminal of the transistor T.

In a manner known per se, the driver D is configured for receiving a supply signal Vsupply. This signal can be a signal adapted to selectively cause the transistor T to be brought to an "on" (conductive) state with a current Id flowing through the source-drain current path (channel) through the transistor T.

In the arrangement of FIG. 1 the intensity of the current Id through the transistor T can be sensed (measured) by means of a sensing voltage Vo derived as a function of the drain-source resistance Rds(on)_p of the transistor T.

In the arrangement of FIG. 1, the voltage Vo is applied, e.g., to a clamp circuit block 10 and then applied to a windowing circuit block 12 actuated over a windowing interval Tstart, Tstop. The signal resulting from windowing in the circuit block 12 is fed to a comparator or analog-to-digital converter (ADC) circuit 14 fed with a reference signal Reference f(Rds(on)_p) to produce an output sensing signal Vout f(Id).

Operation of an arrangement as exemplified in FIG. 1 is based on the relationship Id=Vds/Rds(on)_p already discussed in the foregoing, where Id is the drain current through the transistor T.

Designing and operating of such an arrangement may involve a number of critical factors.

For instance, when the transistor T is turned off (that is non-conductive) the drain-source voltage may reach a (very) high value with the risk of damaging the circuits in the readout chain (e.g., 10, 12, 14). In fact, arrangements as exemplified in FIG. 1 may be supplied with voltages in the range of 25 V.

The clamp circuit block 10 may thus be adapted to limit within certain safety limits the voltage forwarded to the subsequent circuit blocks.

A high speed of intervention and low current absorption may thus represent significant factors, with the current absorbed by the clamp circuit block 10 adding to the amount of current absorbed by the sensing system even when the whole arrangement is not activated.

Another critical issue may lie in the output signal Vo being actually proportional to Vds (only) when the transistor T is "on", that is conductive.

In order to reduce the risk of erroneous readouts, the windowing circuit block 12 of FIG. 1 can be activated (only) over that time zone where proportionality exist. However, especially in those arrangements where current sensing is performed in a continuous manner, windowing may involve an error (distortion) which may not be acceptable in various applications.

Figure 2:
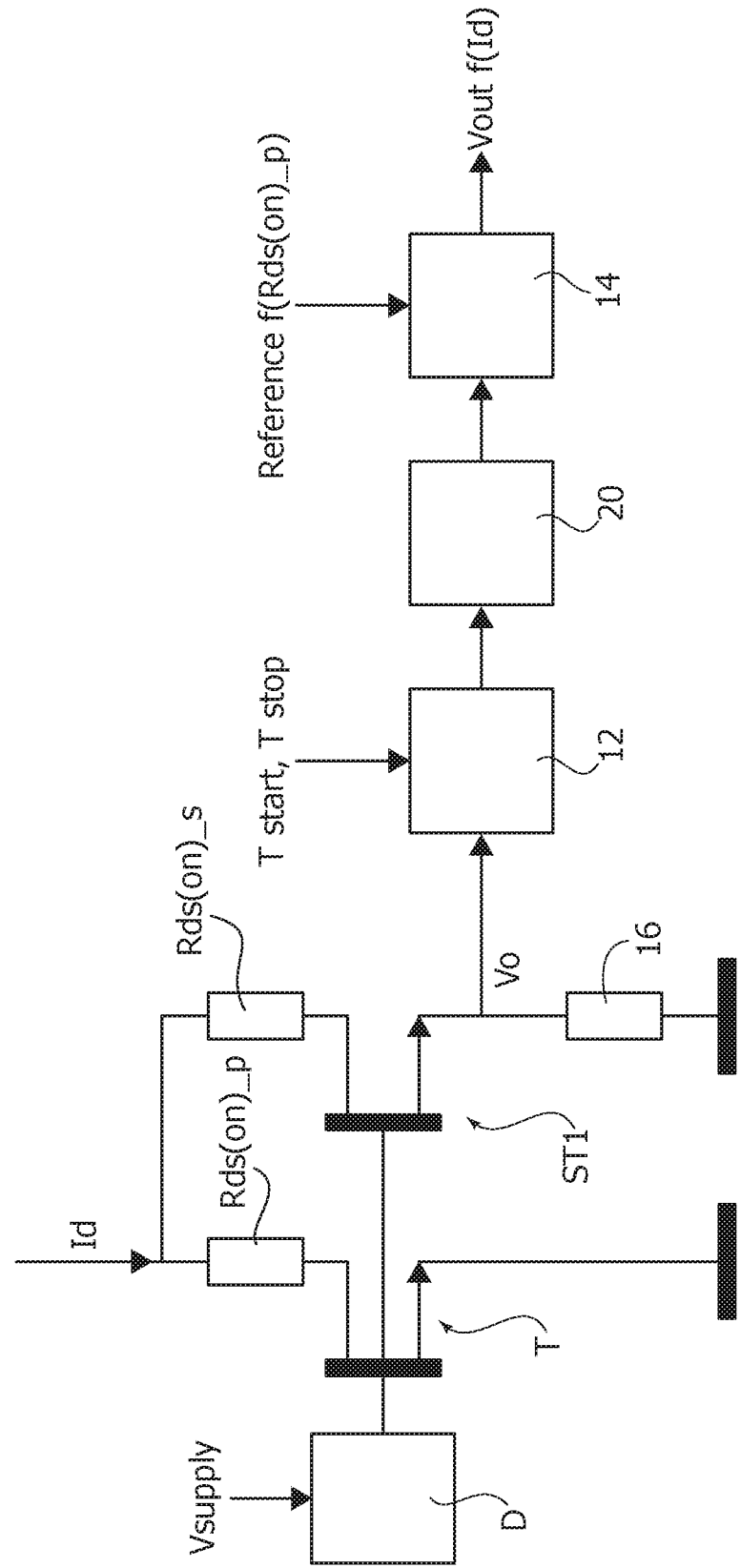
FIG. 2 is a further diagram exemplary of a current sensing circuit.
Figure 3:
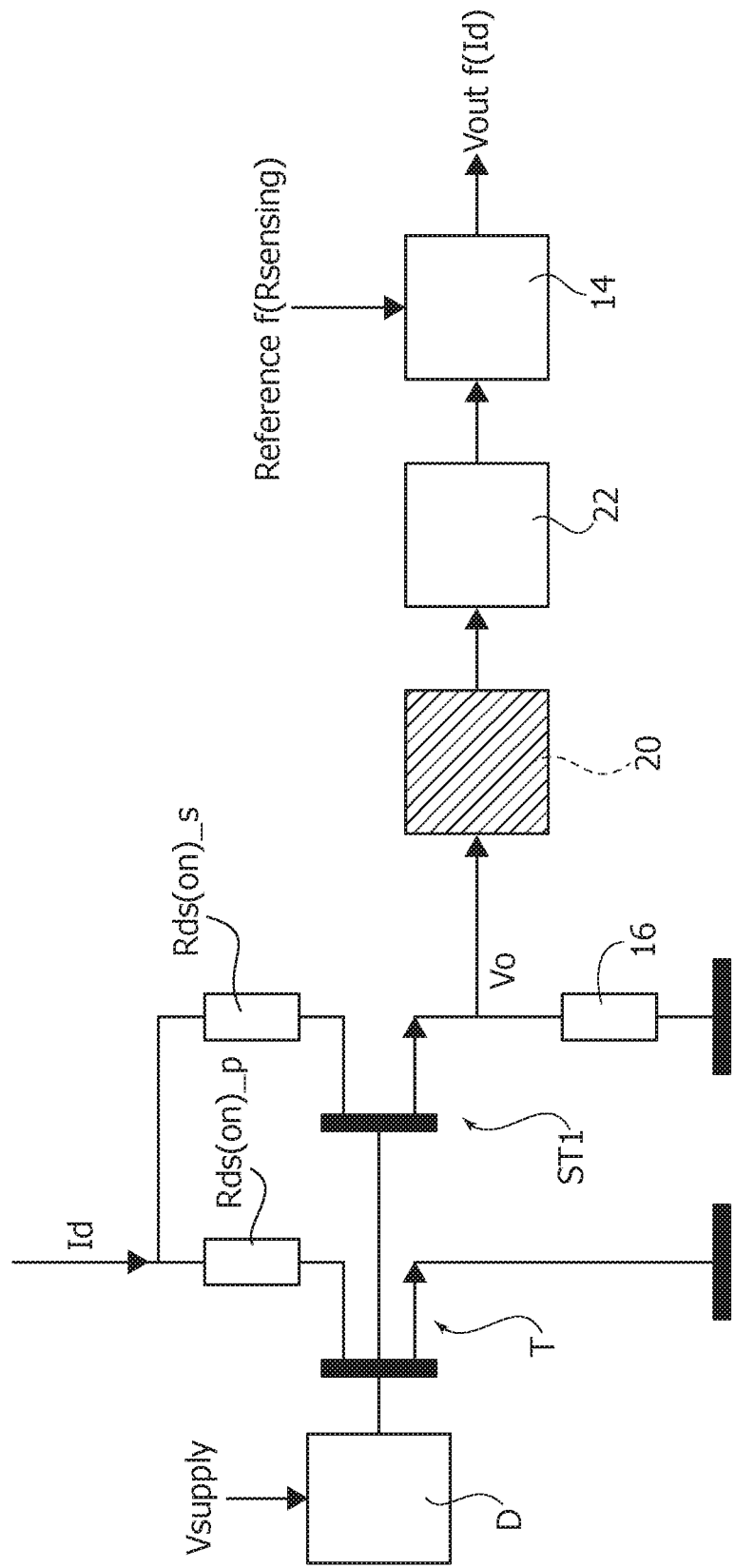
FIG. 3 is a still further diagram exemplary of a current sensing circuit.

The diagrams of FIGS. 2 and 3 are exemplary of an arrangement as disclosed, e.g., in European patent publication EP 3 179 631 A1 corresponding U.S. publication US 2017160316, which are incorporated herein by reference.

In these figures, parts or elements like parts or elements already discussed in connection with FIG. 1 are indicated with like references. A corresponding detailed description will not be repeated here for brevity.

In brief, arrangements as exemplified in FIGS. 2 and 3 involve coupling with the (power) transistor T a sensing transistor ST1 arranged, so-to-say, in parallel with the power transistor T with a readout chain coupled to, e.g., the source terminal of the sensing transistor ST1.

The sensing transistor ST1 of FIGS. 2 and 3 can be selected to be a field-effect transistor, e.g., a MOSFET transistor, of the same type (N-channel or P-channel, respectively) of the power transistor T.

The sensing transistor ST1 will have a drain-source "on" resistance Rds(on)_s.

The sensing transistor ST1 can be arranged with its gate and drain terminals coupled like the homologous terminals (gate and drain) of the power transistor T, with a sensing resistor 16 set between the sensing transistor ST1 (e.g., the source terminal thereof) and ground. The voltage across the sensing resistor 16 is the signal Vo supplied to the readout chain 10.

The role of the value of Rds(on)_s in defining Vo may lead to an excessive spread due to mismatch between Rds(on)_s and the value of the sensing resistor 16.

The sensing resistor 16 may thus be selected with a resistance value Rsensing which is either:

much higher than Rds(on)_s, namely Rsensing>> Rds(on)_s-FIG. 2, or much lower than Rds(on)_s, namely Rsensing<< Rds(on)_s-FIG. 3.

In that way, when the power transistor T is in an "on" condition, the voltage across the sensing resistor 16 (that is the voltage Vo) will correspond essentially to:

the drain-source voltage Vds of the power transistor T if Rds(on)_s<<Rsensing, the output current times the mirror ratio between the power transistor T and the sensing transistor ST1 and the value Rsensing, if Rds(on)_s>>Rsensing.

Both arrangements of FIGS. 2 and 3 make it possible to avoid making the clamp circuit block 10 too complex.

For that reason that circuit is not visible in FIGS. 2 and 3, with just a low-pass filter 20 (possibly) provided "upstream" of the comparator/ADC circuit block 14 to filter out noise.

A good matching between the power transistor T and ST1 may play a role in the former case (FIG. 2).

In fact, a disadvantage of the arrangement of FIG. 2 may lie in the different current density between the power transistor T and the sensing transistor ST1. This may lead to a voltage Vo which is different from Vds in the power transistor T when Vgs is far from the final value.

The result is a Vo function of time during switching (e.g., off/on/off) of the power transistor T. Because of this, the windowing block 12 is still needed.

This drawback can be dealt with by resorting to an arrangement where Rds(on)_s>>Rsensing (that is the latter case considered in the foregoing) where a good matching between T and ST1 may not represent a significant factor and windowing can even be dispensed with in so far as the pulse Vo faithfully mirrors the pulse in the output current.

An arrangement as exemplified in FIG. 3 can provide a good degree of accuracy. However it may lead to small values for Vo, so that implementations of the arrangement of FIG. 3 may involve a voltage amplifier 22 in the readout chain, e.g., between the (optional) low-pass filter 20 and the converter/ADC circuit block 14. This may result in increased noise and, more generally, in reduction of immunity to other sources of nuisance.

Figure 4:
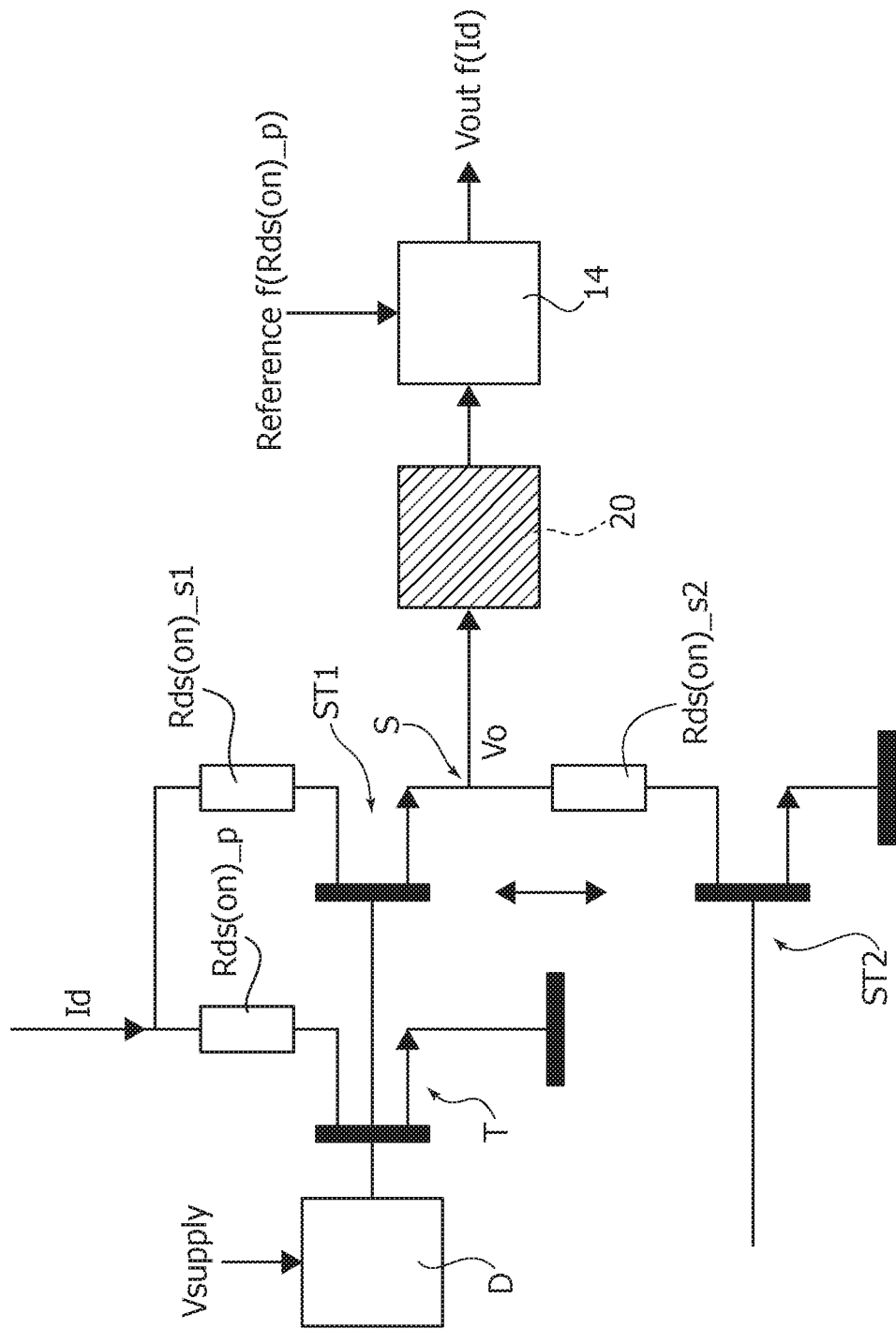
FIG. 4 is a diagram exemplary of a current sensing circuit according to embodiments.
Figure 5:
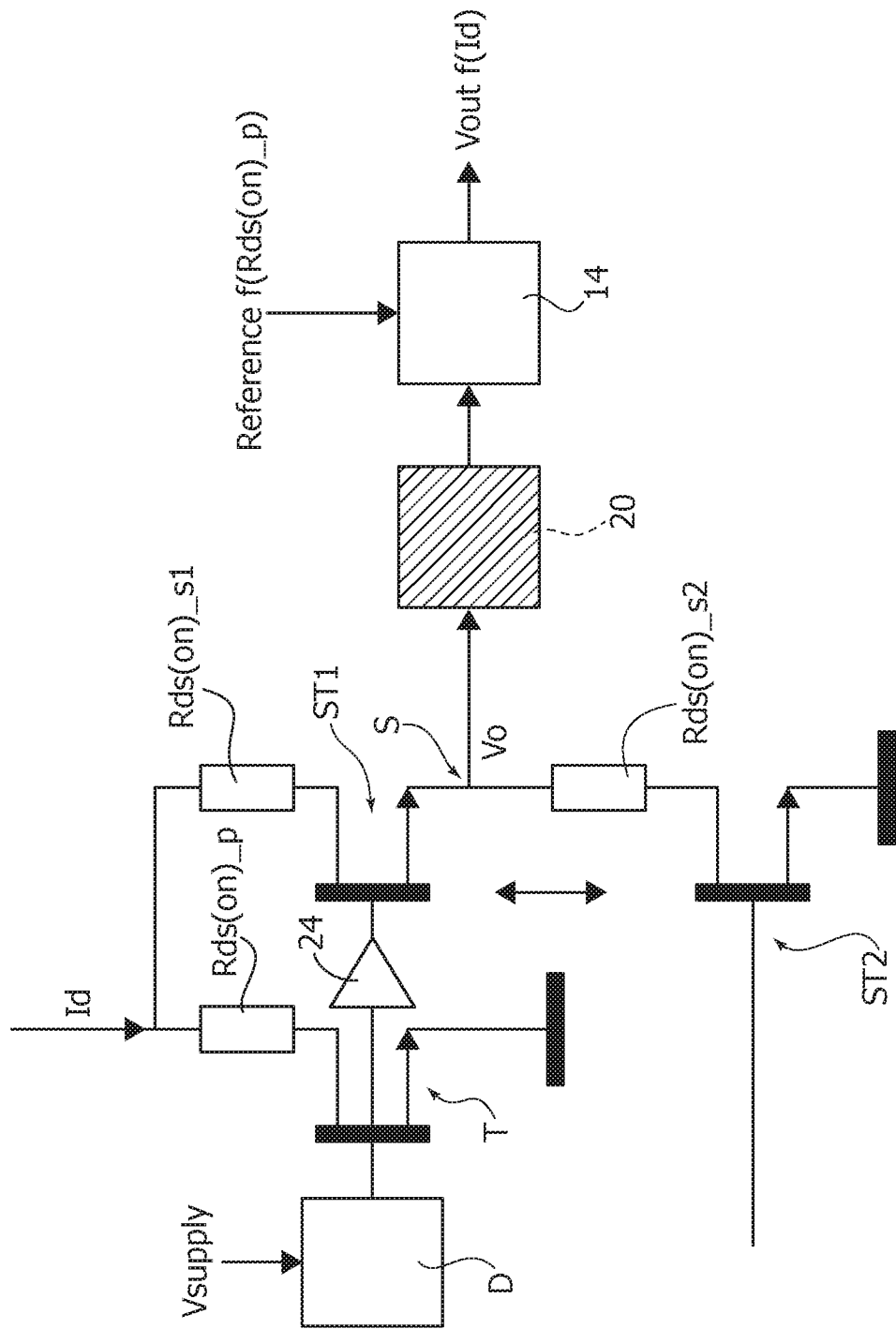
FIG. 5 is a diagram exemplary of a current sensing circuit according to embodiments.

These drawbacks can be overcome by resorting to embodiments as exemplified in FIG. 4 (and FIG. 5).

Once again, parts or elements like parts or elements already discussed in connection with FIGS. 1 to 3 are indicated in FIGS. 4 (and 5) with like references. A corresponding detailed description will not be repeated for brevity.

In one or more embodiments as exemplified in FIG. 4, a further sensing transistor ST2 is provided, so-to-say, replacing the sensing resistor 16.

In one or more embodiments as exemplified in FIG. 4, the sensing transistor ST2 can be selected as a field-effect transistor, e.g., a MOSFET transistor, having a drain-source "on" resistance Rds(on)_s2 as close as possible (that is virtually identical) to the drain-source "on" resistance Rds(on)_s1 of the first sensing transistor ST1, that is:

$$Rds(\text{on})\_s1 = Rds(\text{on})\_s2$$

where the symbol "=" takes into account possible tolerances in the values of the Rds "on" resistance of a field-effect transistor.

In one or more embodiments as exemplified in FIG. 4, the second sensing transistor ST2 can be arranged with its source-drain current path (channel) between the first sensing transistor ST1 and ground so that an intermediate node S between ST1 and ST2 will provide the input voltage Vo to the readout chain.

For the sake of clarity, the various Rds "on" resistances (e.g., Rds(on)_s1 and Rds(on)_s2), which are "intrinsic" to the respective field-effect transistors, are illustrated in the figures as separate elements.

For instance, as exemplified in FIG. 4, the sensing transistor ST2 can be arranged with its drain coupled (at the node S) to the (source of the) first sensing transistor ST1 and the readout chain, and its source coupled to ground, respectively.

The further sensing transistor ST2 can be selected of the same type (that is N-channel or P-channel) of the first sensing transistor ST1 and may have dimensions which may be both different and similar to those of the first sensing transistor ST1.

One or more embodiments will thus relax the requirements in terms of matching the sensing components (e.g., ST1, ST2) with the power transistor T.

In one or more embodiments, the two sensing transistors ST1, ST2 may be of the same type (N-channel or P-channel) of the power transistor T. That is, with the sensing transistors ST1, ST2 of N-channel or, respectively, P-channel according to whether the power transistor T is N-channel or P-channel.

The drive terminal (gate) of the further sensing transistor ST2 may be supplied with the same signal Vsupply fed to the driver D of the power transistor T or by an equivalent signal (e.g., a replica thereof).

Assuming, for the sake of simplicity (yet without loss of generality) that the two sensing transistors ST1, ST2 may be regarded as virtually identical: with the power transistor T "on" (that is, conductive) the voltage Vo at the node S between the two sensing transistors ST1, ST2 will have a value Vds(power)/2 that is half the drain-source voltage Vds(power) of the power transistor T, which is thus proportional to the current Id;

with the power transistor T "off" (that is, non-conductive) the voltage Vo at the node S will be zero (with the current Id also equal to zero since the power transistor T is "off").

In arrangements as exemplified in FIGS. 4 and 5 the voltage Vo will exhibit essentially the same behavior of the case exemplified in FIG. 3 with however a (much) higher value, thus making it possible to dispense with the amplifier stage 22 of FIG. 3.

It was observed that in case of a switching pulse, overshoot phenomena are reduced in embodiments as exemplified in FIG. 4. This makes it possible to dispense with any windowing (no such block in fact shown in FIGS. 4 (and 5)).

Experiments performed in connection with arrangements as exemplified in FIG. 4 show a reduced error in comparison with the arrangement with Rsensing>>Rds(on)_s of FIG. 2 in the case of current Id of the order of 1 A, e.g., due to a spurious spike at the end of the current pulse.

Experiments with a current swipe of 10 to −10 A in the power transistor T show performance comparable with the arrangement of FIG. 3 (Rsensing<<Rds(on)_s) in terms of linearity. With negative high currents and high temperature (e.g., in the case of a "low side" driver of the N-channel type), some of the current flowing through the body-drain diode of the power transistor T, thus slightly reducing sensing accuracy.

The arrangement of FIG. 5 reproduces the same layout of FIG. 4: consequently the previous discussion of FIG. 4 applies directly also to FIG. 5.

The exemplary arrangement of FIG. 5 includes a buffer stage 24 between the gate of the power transistor T and the gate of the (first) sensing transistor ST1. In one or more embodiments, the buffer stage 24 may act as a sort of comparator which is active on the gate-source voltage Vgs of the power transistor T and facilitates a more "defined" intervention of the sensing arrangement.

A circuit according to one or more embodiments may include:

a (main, e.g., power) field effect transistor (e.g., T) having a gate configured (e.g., D) to be driven via a drive signal (e.g., Vsupply), the field effect transistor having a drain-source voltage drop (e.g., Vds) indicative of the intensity of a current (e.g., Id) flowing in the (source-drain) current path through the field effect transistor (when conductive), and a pair of sensing transistors, the pair including:

i) a first sensing field effect transistor (e.g., ST1) arranged with its drain and gate coupled with the drain and the gate of the (main, e.g., power) field effect transistor, respectively, ii) a second sensing field effect transistor (e.g., ST2) having a gate configured for receiving a replica of the drive signal (e.g., Vsupply), the second sensing field effect transistor arranged with its (source-drain) current path in series with the (source-drain) current path of the first sensing field effect transistor, wherein a sensing signal (e.g., Vo) at a (common) sensing node (e.g., S) between the first sensing field effect transistor and the second sensing field effect transistor is indicative of the current intensity flowing in the (source-drain) current path of the field effect transistor.

In one or more embodiments, the second sensing field effect transistor may be set between the first sensing field effect transistor and ground.

One or more embodiments may include a buffer stage (e.g., 24) between the gate of the (main, e.g., power) field effect transistor and the gate of the first sensing field effect transistor.

In one or more embodiments, the field effect transistors in the pair of sensing transistors may be (both) of the same type, N-channel or P-channel, of the field effect transistor.

In one or more embodiments, the field effect transistors in the pair of sensing transistors may have substantially the same drain-source on-resistance value (by taking into account usual tolerances).

In one or more embodiments the field effect transistor may include an (e.g., power) MOSFET transistor; and/or the field effect transistors in the pair of sensing transistors may include MOSFET transistors.

One or more embodiments may include a comparator or analog-to-digital converter circuit block (e.g., 14) coupled (e.g., via a low-pass filter such as 20) with the sensing node between the first sensing field effect transistor and the second sensing field effect transistor.

One or more embodiments may thus include a low-pass filter (e.g., 20) between the sensing node between the first sensing field effect transistor and the second sensing field effect transistor and the comparator or analog-to-digital converter block.

In one or more embodiments, a device (e.g., "low-side" or "high-side" driver, for instance in an automotive application) may include a circuit according to one or more embodiments, and a driver circuit (e.g., D) coupled to the gate of the (main, e.g., power) field effect transistor, the driver circuit sensitive to the drive signal (e.g., Vsupply).

In one or more embodiments a method may include driving a (main, e.g., power) field effect transistor by applying (e.g., via driver such as D) a drive signal to the gate thereof. The field effect transistor has a drain-source voltage drop indicative of the intensity of a current flowing in the (source-drain) current path through the field effect transistor. The field effect transistor can be coupled with a pair of sensing transistors. The pair includes i) a first sensing field effect transistor arranged with its drain and gate coupled with the drain and the gate of the field effect transistor, respectively, and ii) a second sensing field effect transistor having a gate configured for receiving a replica of the drive signal. The second sensing field effect transistor is arranged with its (source-drain) current path in series with the (source-drain) current path of the first sensing field effect transistor. A sensing signal at a sensing node between the first sensing field effect transistor and the second sensing field effect transistor is indicative of the current intensity flowing in the current path of the field effect transistor.

Without prejudice to the underlying principles, the details and embodiment may vary, even significantly, with respect to what has been described by way of example only without departing from the extent of protection.

The extent of protection is defined by the annexed claims.

What is claimed is:

1. A circuit, comprising:
   a drive signal input configured to carry a drive signal;
   a field effect transistor having a source and a drain and a current path therebetween, the field effect transistor also having a gate coupled to the drive signal input;
   a first sensing field effect transistor having a source, a drain coupled to the drain of the field effect transistor, a current path between the source and the drain, and a gate coupled to the gate of the field effect transistor;
   a second sensing field effect transistor having a gate configured to receive a replica of the drive signal, the second sensing field effect transistor arranged with a current path in series with the current path of the first sensing field effect transistor; and
   a sensing node between the first sensing field effect transistor and the second sensing field effect transistor, wherein during operation a sensing signal at the sensing node is indicative of a current intensity flowing in the current path of the field effect transistor, wherein the first sensing field effect transistor and the second sensing field effect transistor have substantially the same drain-source on resistance value.

2. The circuit of claim 1, wherein the current path of the second sensing field effect transistor is between the first sensing field effect transistor and a ground node.

3. The circuit of claim 1, further comprising a buffer stage between the gate of the field effect transistor and the gate of the first sensing field effect transistor.

4. The circuit of claim 1, wherein the first sensing field effect transistor and the second sensing field effect transistor are of the same conductivity type.

5. The circuit of claim 1, wherein the field effect transistor is a MOSFET transistor.

6. The circuit of claim 1, wherein the first sensing field effect transistor and the second sensing field effect transistor are MOSFET transistors.

7. The circuit of claim 1, further comprising a comparator coupled to the sensing node.

8. The circuit of claim 7, further comprising a low-pass filter between the sensing node and the comparator.

9. The circuit of claim 1, further comprising an analog-to-digital converter coupled to the sensing node.

10. The circuit of claim 9, further comprising a low-pass filter between the sensing node and the analog-to-digital converter.

11. The circuit of claim 1, further comprising a driver circuit coupled to the gate of the field effect transistor, an output of the driver circuit being coupled to the drive signal input.

12. The circuit of claim 1, further comprising a low-pass filter directly connected to the sensing node.

13. A method, comprising:
    receiving a drive signal at a gate of a field effect transistor thereby causing a drain-source voltage drop indicative of an intensity of a current flowing in a current path of the field effect transistor;
    receiving the drive signal at a gate of a first sensing field effect transistor that has a drain coupled with a drain of the field effect transistor, the first sensing field effect transistor having a first on-resistance;
    receiving a replica of the drive signal at a gate of a second sensing field effect transistor, the second sensing field effect transistor having a second on-resistance substantially identical to the first on-resistance, the second sensing field effect transistor having a current path in series with a current path of the first sensing field effect transistor; and
    sensing, with a sensing circuit, a sensing signal at a sensing node between the first sensing field effect transistor and the second sensing field effect transistor, the sensing signal being indicative of the intensity of the current flowing in the current path of the field effect transistor.

14. The method of claim 13, wherein sensing the sensing signal comprises comparing a voltage at the sensing node to a reference voltage with a comparator of the sensing circuit.

15. The method of claim 14, further comprising low-pass filtering the sensing signal before comparing the voltage at the sensing node to the reference voltage.

16. The method of claim 13, wherein sensing the sensing signal comprises converting a voltage at the sensing node to a digital value with an analog-to-digital converter of the sensing circuit.

17. The method of claim 16, further comprising low-pass filtering the sensing signal before converting the voltage at the sensing node to the digital value.

18. A circuit, comprising:
    a driver configured to generate a drive signal;
    a field effect transistor having a source and a drain and a current path therebetween, the field effect transistor also having a gate coupled to an output of the driver;
    a first sensing field effect transistor having a source, a drain coupled to the drain of the field effect transistor, a first on-resistance, and a gate coupled to the gate of the field effect transistor;

a second sensing field effect transistor having a second on-resistance substantially identical to the first on-resistance and a gate configured to receive a replica of the drive signal, the second sensing field effect transistor arranged with a current path in series with a current path of the first sensing field effect transistor;

a sensing node between the first sensing field effect transistor and the second sensing field effect transistor; and a sense circuit with an input coupled to the sensing node.

19. The circuit of claim 18, wherein the sense circuit comprises a comparator.

20. The circuit of claim 18, wherein the sense circuit comprises an analog-to-digital converter.

21. The circuit of claim 18, further comprising a low-pass filter between the sensing node and the sense circuit.

22. The circuit of claim 18, further comprising a buffer stage between the gate of the field effect transistor and the gate of the first sensing field effect transistor.

23. The circuit of claim 18, wherein the field effect transistor is a MOSFET transistor;

wherein the first sensing field effect transistor and the second sensing field effect transistor are MOSFET transistors; and wherein the first sensing field effect transistor and the second sensing field effect transistor are of the same conductivity type.

* * * * *